(12) United States Patent
Hilliard et al.

(10) Patent No.: US 6,337,602 B2
(45) Date of Patent: Jan. 8, 2002

(54) METHOD AND APPARATUS FOR ACTIVE ISOLATION IN INDUCTIVE LOOP DETECTORS

(75) Inventors: Steven R. Hilliard, Knoxville; Geoffrey W. Hilliard, Signal Mountain, both of TN (US)

(73) Assignee: Inductive Signature Technologies, Inc., Knoxville, TN (US)

( * ) Notice: Subject to any disclaimer, the term of this patent is extended or adjusted under 35 U.S.C. 154(b) by 0 days.

(21) Appl. No.: 09/755,343

(22) Filed: Jan. 5, 2001

Related U.S. Application Data
(60) Provisional application No. 60/174,627, filed on Jan. 5, 2000.

(51) Int. Cl.[7] .............................................. G08G 1/042
(52) U.S. Cl. ..................... 331/65; 331/165; 324/207.16; 340/941
(58) Field of Search .............................. 331/65, 117 R, 331/117 FE, 165, 166, 167; 324/207.16, 207.18, 207.19; 340/941

(56) References Cited

U.S. PATENT DOCUMENTS

| | | |
|---|---|---|
| 1,992,214 A | 2/1935 | Katz |
| 3,587,040 A * | 6/1971 | Fathauer ..................... 340/938 |
| 3,641,569 A | 2/1972 | Bushnell et al. |
| 3,775,742 A * | 11/1973 | Koerner et al. ............. 340/938 |
| 3,873,964 A | 3/1975 | Potter |
| 3,927,389 A | 12/1975 | Neeloff |
| 3,984,764 A | 10/1976 | Koerner |
| 4,276,539 A | 6/1981 | Eshraghian et al. |
| 4,843,259 A * | 6/1989 | Weisshaupt ................... 331/65 |
| 5,198,811 A | 3/1993 | Potter et al. |
| 5,245,334 A | 9/1993 | Gebert et al. |
| 5,491,475 A | 2/1996 | Rouse et al. |
| 5,523,753 A | 6/1996 | Fedde et al. |
| 5,614,894 A | 3/1997 | Stanczyk |
| 5,861,820 A | 1/1999 | Kerner et al. ........................... |

* cited by examiner

*Primary Examiner*—Siegfried H. Grimm
(74) *Attorney, Agent, or Firm*—Pitts & Brittian, P.C.

(57) ABSTRACT

An oscillator circuit for use with a wire-loop inductive sensor and method for use. The oscillator circuit includes two balanced capacitors coupled to the wire-loop sensor, and an excitation circuit connectable with the capacitors at a selected polarity. Wherein, when the excitation circuit is connected to the capacitors, one of the capacitors is charged while the other capacitor is discharged, and both of the capacitors are discharged when the excitation circuit is disconnected to produce a pair of decaying oscillations having a caduceus-shaped output. The oscillator circuit highly attenuates common-mode noise detected by the wire-loop and differential noise from both ambient and crosstalk sources is filtered by active isolation.

13 Claims, 7 Drawing Sheets

METHOD AND APPARATUS FOR ACTIVE ISOLATION IN INDUCTIVE LOOP DETECTORS

CROSS-REFERENCE TO RELATED APPLICATIONS

This application claims the benefit of U.S. Provisional Application No. 60/174,627, filed Jan. 5, 2000.

STATEMENT REGARDING FEDERALLY SPONSORED RESEARCH OR DEVELOPMENT

Not Applicable.

BACKGROUND OF THE INVENTION

1. Field of the Invention

The present invention generally relates to the measurement of inductance, and more particularly to inductive vehicle detectors.

2. Description of the Related Art

Inductive wire-loop vehicle detectors of the prior art are typically based on the Colpitts oscillator using a wire-loop sensor. A simple wire-loop has two terminals that are typically connected to the rest of the detector circuit through a pair of lead wires. The lead wires connected to the primary coil of a transformer serving as a common-mode choke typically having 40 dB common-mode noise attenuation. The secondary coil of the transformer is connected to a capacitor effectively forming an inductance-capacitance-resistance (LCR) circuit with the wire-loop.

In the typical Colpitts oscillator-based detector, one leg of the LCR circuit is connected to a positive direct current (DC) power supply terminal. Because of this arrangement, the common-mode noise appearing at the secondary coil of the transformer is converted to differential noise as the common-mode current flowing through the leg of the secondary coil tied to the positive power-supply terminal is drained away. Consequently, the common-mode current flowing through the other leg of the secondary coil charges the capacitor of the LCR circuit. These current flows create a differential noise voltage, which is added to the existing different noise on the circuit. The largest component of common-mode noise is typically power-line noise around 60 Hz. For a typical two-meter loop having three turns of wire, the differential noise induced by a 60 Hz power line is at 60 Hz and its harmonics. The primary method for canceling ambient noise in prior-art detectors is to integrate the sampling period of the detector over a time chosen to coincide with the local power-line voltage period.

Additionally, where multiple wire-loop sensors are placed in close proximity, crosstalk is a concern. Crosstalk between detectors is a function of the inductive coupling between the wire-loops and the transformers as well as the relative phase and amplitudes of the oscillating signals on the loops. The primary method for mitigating the effects of crosstalk in prior-art detectors is to use different capacitance values in the LCR circuits. This tends to randomize the relative phase of the oscillating signals on adjacent loops over time.

The primary methods for minimizing crosstalk and canceling ambient noise described above tend to limit the sampling rate of prior-art wire-loop sensors to approximately 60 Hz, which is well below what is desirable for recording repeatable inductive signatures on vehicles traveling at highway speeds.

BRIEF SUMMARY OF THE INVENTION

It is desirable to isolate signal from noise in an inductive vehicle detector. Inductance is typically measured indirectly as a function of the resonant frequency of an LCR circuit in which the oscillation frequency is approximately inversely proportional to the square root of the product of inductance and capacitance. In practice, significant errors in the measurement of this oscillation frequency are typical In the absence of noise errors, the measured inductance of a wire-loop is independent of the polarity of the excitation current used to make the LCR circuit oscillate. However, when random and non-random differential noise is induced into the circuit, typically through the wire-loop, lead-wire, and transformer, the resulting inductance measurement errors strongly depend on the polarity of the excitation current. By employing an oscillator circuit having two balanced capacitors and by controlling the polarity of the excitation current, the effects of common-mode and differential noise can be greatly reduced with minimal effect on the inductance measured at the wire-loop sensor.

BRIEF DESCRIPTION OF THE SEVERAL VIEWS OF THE DRAWINGS

The above-mentioned features of the present invention will become more clearly understood from the following detailed description of the invention read together with the drawings in which.

DETAILED DESCRIPTION OF THE INVENTION

An oscillator circuit for use in an inductive vehicle detector is shown generally at 10 in the Figures. Inductance is typically measured indirectly as a function of the frequency of an LCR oscillator in which the oscillation frequency is approximately inversely proportional to the square root of the product of inductance and capacitance. In practice, significant errors in the measurement of this oscillation frequency are typical. In the absence of noise errors, the measured inductance of a wire-loop is independent of the polarity of the excitation current driving the oscillation of the LCR circuit. However, both random and non-random differential noise induced into the circuit cause inductance measurement errors, which have a polarity that is strongly dependent on the polarity of the excitation current.

Figure 1:
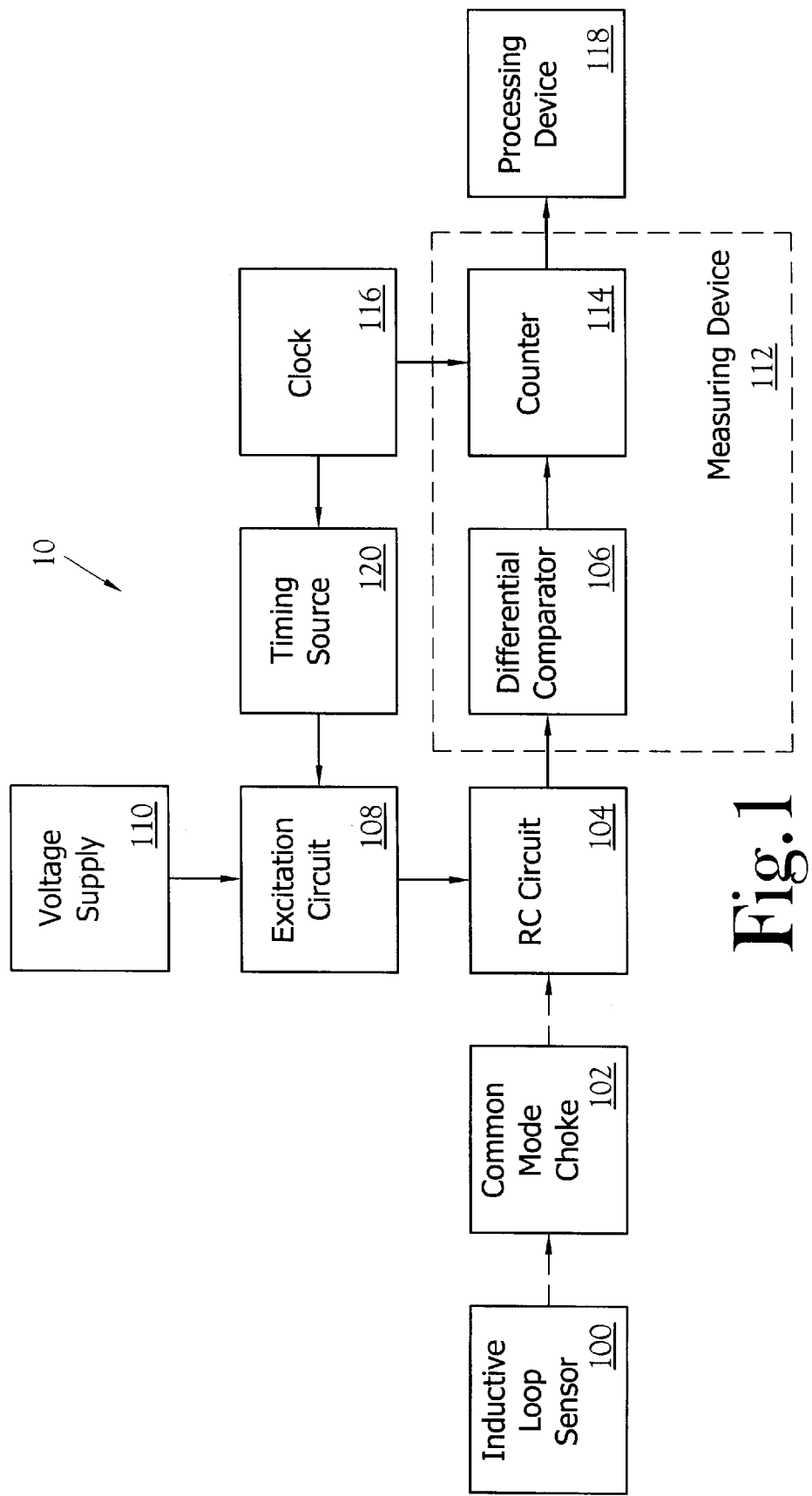
FIG. 1 illustrates a block diagram of one embodiment of the oscillator circuit of the present invention.

FIG. 1 illustrates a block diagram of one embodiment of an inductive vehicle detector including the oscillator circuit 10 of the present invention. The vehicle detector includes an inductive loop sensor 100. Those skilled in the art will recognize the various configurations that may be used for the inductive loop sensor 100. A simple inductive loop sensor 100 is a wire-loop having two terminals connected to the rest of the detector circuit through a pair of lead wires. Alternatively, the wire-loop is connected to the primary coil of a transformer serving as a common-mode choke 102, as illustrated in FIG. 1. The secondary coil of the transformer is connected to a resistance-capacitance (RC) circuit 104 forming an inductance-capacitance-resistance (LCP) circuit with the wire-loop 100. Typically, connecting the wire-loop through a common-mode choke 102 provides approximately 40 dB of common-mode noise attenuation. An excitation circuit 108 interruptably connects a voltage supply 110 to the secondary coil of the common-mode choke 102. In the illustrated embodiment, the oscillating output of the oscillator circuit 10 is passed to a measuring device 112 that samples the frequency of the oscillation at any given time. The frequency of the oscillation in turn relates to the inductance of the wire-loop 100. The measuring device 112 includes a differential comparator 106 whose output switches whenever the differential output of the oscillator circuit 10 changes polarity. The measuring device 112 also includes a counter 114 that counts the pulses generated by a high-speed, fixed-frequency clock 116 gated by the differential comparator 106. These measurements are then processed by a processing device 118 to extract useful information from the data.

The excitation circuit 108 is typically implemented using a plurality of switches. These switches are gated by precisely timed digital signals that are generated by a timing source 120. In one embodiment, the timing source 120 is implemented using a binary counter that counts the high-speed clock source 116. Typically, the binary counter 120 is initialed to zero at the start of a measurement cycle and the counter proceeds to count each successive pulse from the clock source. When a predetermined count is reached, a gate signal is generated to turn on one pair of switches and counting continues until a second predetermined count is reached at which time the gate signal is terminated to turn off the pair of switches. The measurement cycle is complete when a third predetermined count is reached, and a new cycle begins.

Figure 2:
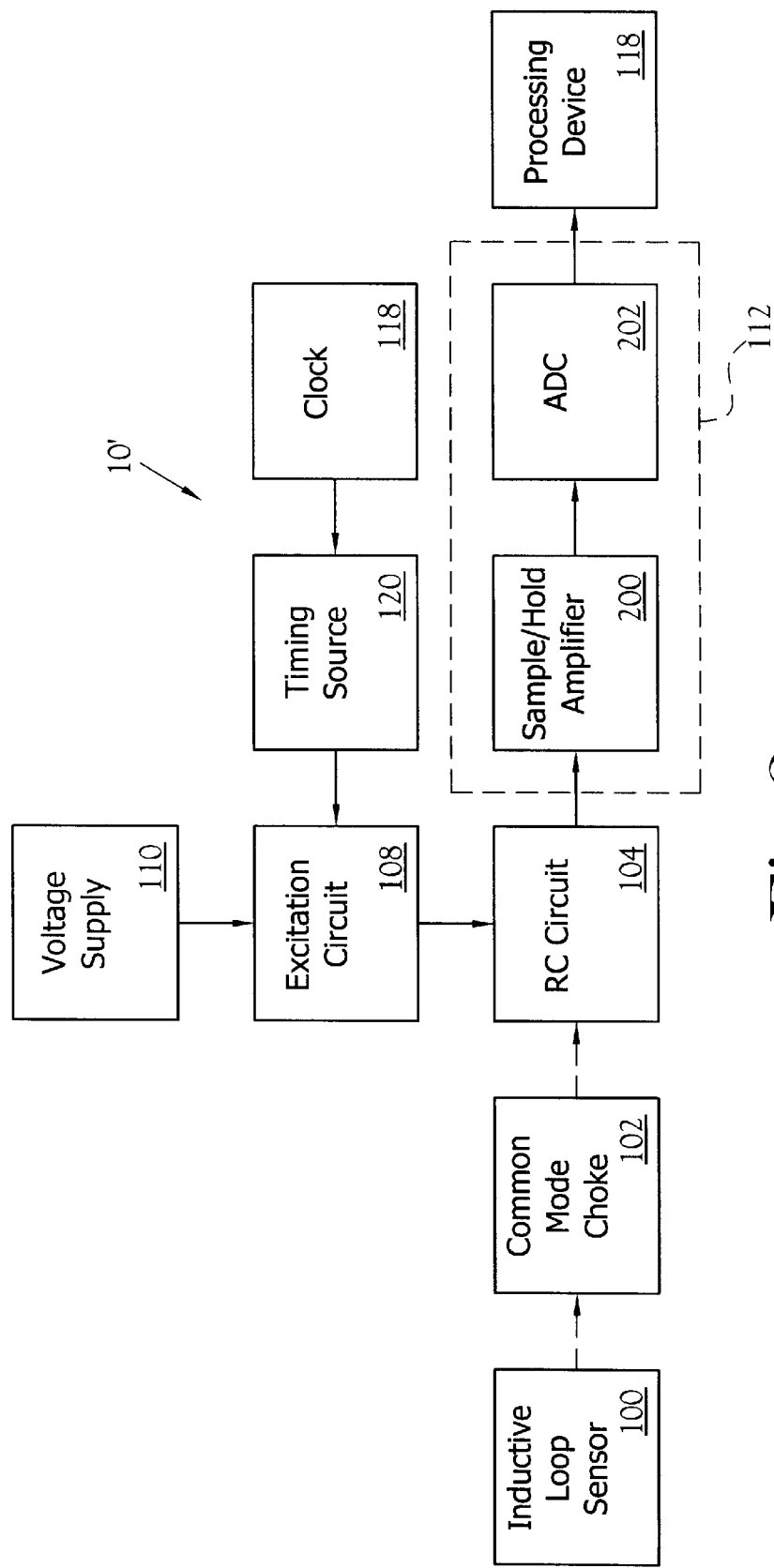
FIG. 2 illustrates a block diagram of an alternate embodiment of the oscillator circuit of the present invention.

FIG. 2 illustrates a block diagram of an alternate embodiment of the oscillator circuit 10' of the present invention. In the illustrated embodiment, the measuring device 112 is replaced by a differential sample-and-hold amplifier 200 feeding an analog-to-digital converter (ADC) 202. The differential sample-and-hold amplifier 200 combined with the ADC 202 provide greater flexibility over the frequency measuring device 112 in the aforementioned embodiment by sampling the entire differential output of the oscillator circuit 10, as opposed to only sampling the zero crossings. To develop a baseline, the decaying sinusoids are sampled at multiple points which allows a determination of the base resistance and inductance of the inductive sensor. This baseline sampling need only occur once, but can be repeated to monitor the oscillator circuit 10 for baseline drift, which, for example, can be caused by temperature variations. Thereafter, the decay sinusoids are sampled to determine the change in the inductance of the wire-loop 100 due to the presence of a vehicle or other metal object. Again, the measurements are processed by a processing device 118 to extract useful information from the data.

Figure 3:
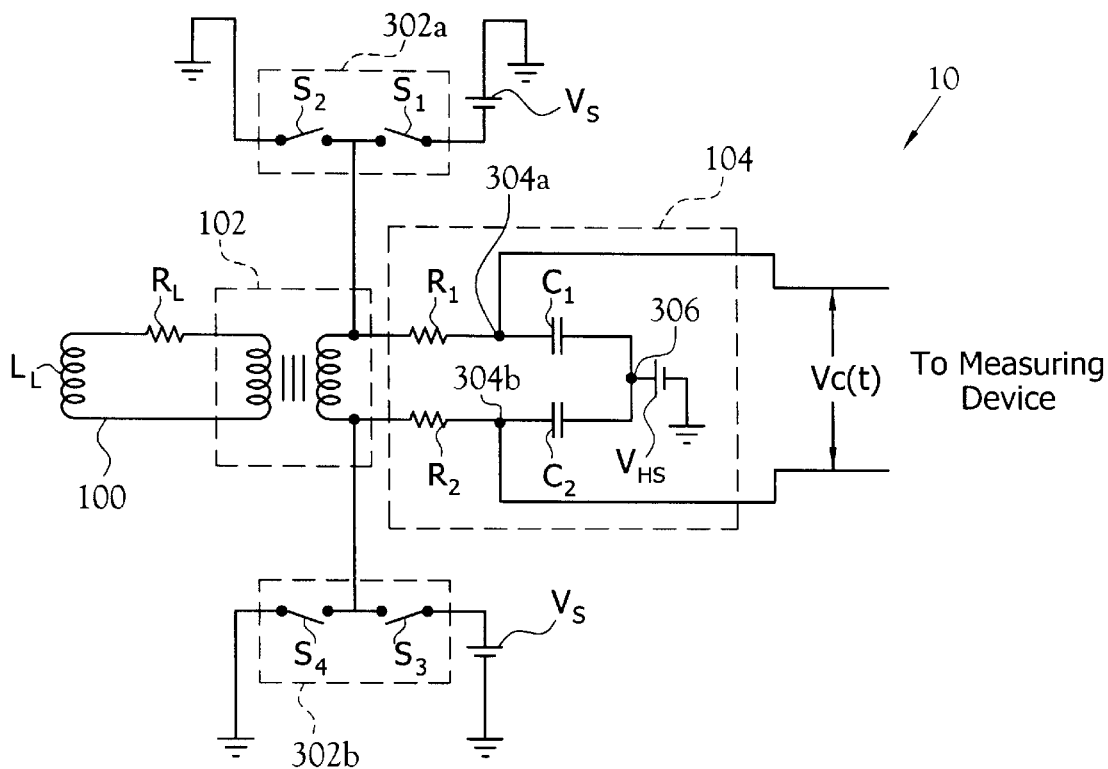
FIG. 3 is a schematic diagram of the oscillator circuit embodied in FIG. 1.

FIG. 3 is a schematic diagram of the oscillator circuit 10 embodied in FIG. 1. The oscillator circuit 10 is an inductance-capacitance-resistance (LCR) oscillator having two legs. In the illustrated embodiment, each leg including a resistance $R_1$, $R_2$ in series with a capacitor $C_1$, $C_2$. Those skilled in the art will recognize that $R_1$, $R_2$ can represent the inherent resistance of the circuit or discrete resistors selected to balance the circuit. The RC circuit 104 is coupled to a wire-loop sensor 100 used as a sensor. In the illustrated embodiment, the wire-loop sensor 100 includes an inherent inductance $L_L$ and a resistance $R_L$ connected via the common-mode choke 102. Again, those skilled in the art will recognize that $R_L$ and $L_L$ typically represent the inherent inductance and resistance of the wire loop and that discrete components are not typically used. Further, those skilled in the art will recognize that the wire-loop sensor 100 may be directly connected to the RC circuit if desired, without departing from the scope and spirit of the present invention. Each leg of the oscillator 10 is connected to an input of the differential comparator 106. Because two capacitors $C_1$, $C_2$ are used in this LCR oscillator 10, rather than the single capacitor that is typical of the prior-art, the oscillator output resembles the Caduceus, hence it is useful to refer to the circuit of the present invention as a Caduceus oscillator 10.

The two capacitors $C_1$, $C_2$ prevent the common-mode noise passed through the common-mode choke 102 from being converted into differential noise, as occurs in conventional oscillator circuits used for inductive sensors. In the illustrated embodiment, the common-mode noise from the common-mode choke 102 appears as a common-mode voltage at the Caduceus oscillator outputs 304a, 304b. This common-mode voltage is rejected with a high attenuation by either the differential comparator 106 or the differential sample-and-hold circuit 200. Those skilled in the art will recognize that while the common terminal 306 of the two capacitors $C_1$, $C_2$ is depicted as connected to a biasing voltage $V_{HS}$ at one-half of the power supply voltage in FIG. 3, the common terminal 306 can be fixed at a different voltage potential, if desired. By using a biasing voltage $V_{HS}$, it is possible to use a single positive supply voltage supply without the need for a negative voltage supply and, further, prevents the voltage between the capacitors $C_1$, $C_2$ from floating.

The excitation circuit 108 includes two pairs of switches 302a 302b arranged in a bipolar charging arrangement with one switch $S_1$, $S_3$ of each switch pair 302 connected to a voltage supply $V_S$ and the other switch $S_2$, $S_4$ connected to ground. The switch pairs 302 are arranged in a totem-pole configuration. In one embodiment, the switches $S_1$–$S_4$ are implemented using power metal-oxide semiconductor field effect transistors (MOSFETs); however, those skilled in the art will recognize that other switches may be used without departing from the scope and spirit of the present invention. The voltage supply $V_s$ is a direct current (DC) power supply producing a positive voltage and, typically, the supply voltage to each switch pair 302 is the same.

There are several allowable switching configurations of the switches $S_1$–$S_4$ in FIG. 3. First, all switches $S_1$–$S_4$ are opened to allow the Caduceus oscillator 10 to oscillate freely. Second, the ground-connected switches $S_2$, $S_4$ are closed to quench the Caduceus oscillator 10 to ground. Third, the voltage supply connected switches $S_1$, $S_3$ are closed to quench the Caduceus oscillator 10 to the positive supply voltage. Finally, a voltage-supply-connected switch $S_1$, $S_3$ from one switch pair 302 and a ground-connected switch $S_2$, $S_4$ from the other switch pair 302 are momentarily closed to charge the Caduceus oscillator 10 to a given polarity depending on the desired direction of current flow through the excitation circuit 108. For ease of discussion, the set of switches represented by switches $S_1$ and $S_4$ and the set of switches represented by switches $S_2$ and $S_3$ will be referred to as the first set and the second set, respectively. It is undesirable for both switches of either switch pair 302 to be closed simultaneously, i.e., both $S_1$ and $S_2$ closed or both $S_3$ and $S_4$ closed.

When the Caduceus oscillator 10 is charged, the voltage on the capacitors $C_1$, $C_2$ is initialized very close to the power supply voltage and practically all of the accumulated noise voltage from the previous cycle is eliminated. When the Caduceus oscillator 10 is decoupled from the power supply and begins to oscillate, any common-mode or differential noise currents present in the circuit, integrated over observed time, produce an accumulating noise voltage on the capacitors. Accordingly, it is desirable to sample the Caduceus oscillator outputs 304 soon after the power supply is decoupled so that less accumulated noise will be present [i.e., the accumulated noise increases while the sinusoid decays].

Figure 4:
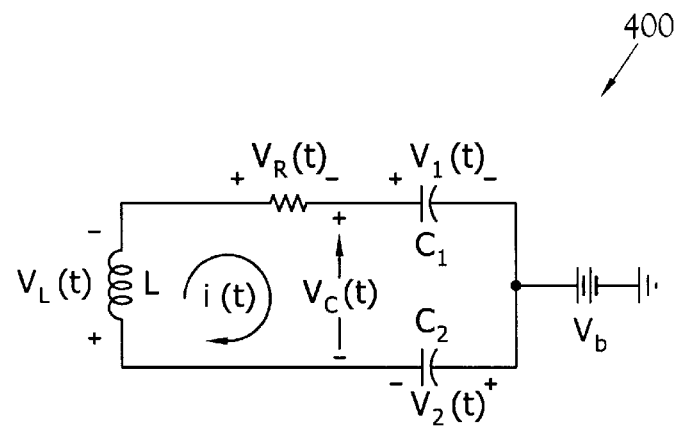
FIG. 4 is a simplified schematic diagram of the oscillator circuit embodied in FIG. 3.

FIG. 4 illustrates a simplified schematic diagram of the Caduceus oscillator 400 shown in FIG. 3. The equation describing the Caduceus oscillator 400 in the time domain is $$v_c(t) = [v_1(0^+) + v_2(0^+)] \left( e^{\frac{R}{2L}t} \sqrt{1 + \left(\frac{\frac{R}{2L}}{\sqrt{\frac{1}{LC_s} - \left(\frac{R}{2L}\right)^2}}\right)^2} \right) \left[ \cos\left( \sqrt{\frac{1}{LC_s} - \left(\frac{R}{2L}\right)^2} t - \tan^{-1}\left( \frac{\frac{R}{2L}}{\sqrt{\frac{1}{LC_s} - \left(\frac{R}{2L}\right)^2}} \right) \right) \right] u(t) \quad (1)$$

where $$C_s = \frac{C_1 C_2}{C_1 + C_2}.$$

If the circuit is very underdamped, the differential voltage input to the comparator can be rewritten as $$v_c(t) = [v_1(0^+) + v_2(0^+)] \left( e^{\frac{R}{2L}t} \cos\left( \frac{t}{\sqrt{LC_s}} \right) \right) u(t) \quad (2)$$

Figure 5A:
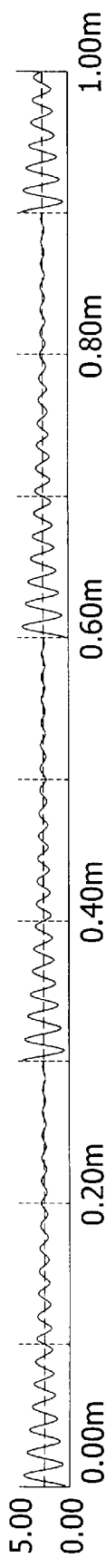
FIG. 5a is a graphic representation of one output of the oscillator circuit of the present invention using the circuit of FIG. 3.
Figure 5B:
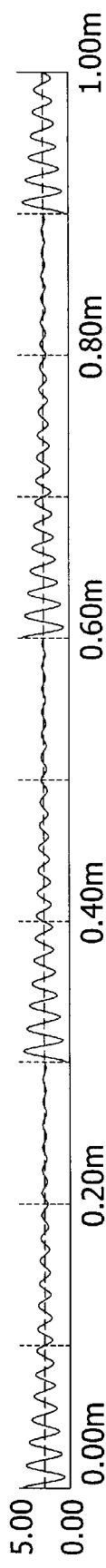
FIG. 5b is a graphic representation of the other output of the oscillator circuit of the present invention using the circuit of FIG. 3.
Figure 5C:
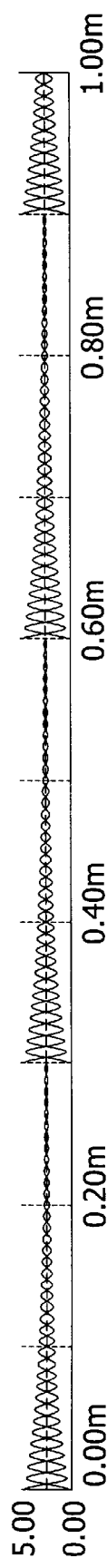
FIG. 5c is a graphic representation of the output of FIG. 5a overlain with the output of FIG. 5b.

The inputs to the differential comparator are illustrated graphically in FIGS. 5a–5c. FIGS. 5a and 5b represent the respective inputs to the positive and negative terminals of the differential comparator. FIG. 5c illustrates the input of FIG. 5a overlain with the input of FIG. 5b. The sinusoidal decay produced by momentarily closing the first set of switches $S_1$, $S_4$ is depicted at t=0.3 milliseconds and t=0.9 milliseconds and the opposite polarity sinusoidal decay produced by momentarily closing the second set of switches $S_2$, $S_3$ is depicted at t=0.0 milliseconds, and t=0.6 milliseconds in FIGS. 5a–5c.

Figure 5D:
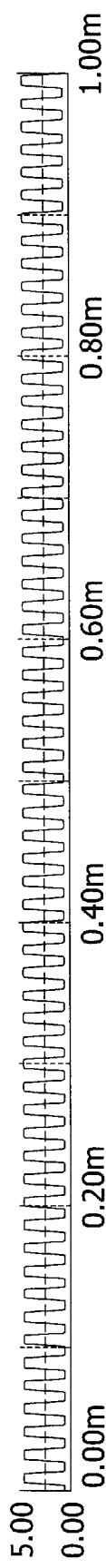
FIG. 5d is a graphic representation of the pulse-train output of the differential comparator of the circuit of FIG. 3.

When a differential comparator 106 is used, the frequency of the Caduceus oscillator 10 is measured by timing the comparator output pulse-train, as illustrated in FIG. 5d. One method of timing the pulse-train is counting a high-speed clock 116 with a counter 114 gated by the pulse-train, as illustrated in FIG. 1. The counter 114 can be gated on the leading edge, the trailing edge, or both the leading and trailing edges of the comparator output pulse-train. In one embodiment the counter 114 is gated on both edges. In the illustrated embodiment, two or more gated counts are added together to produce a summed count having reduced quantization error relative to any single gated count. However, it should be noted that, for a pulse-train having a given number of zero-crossings per cycle, only the second half of the counts captured by the counter 114 are summed because discontinuities arise in the inductive signatures when more than the last half of the captured counts are double integrated.

Figure 6:
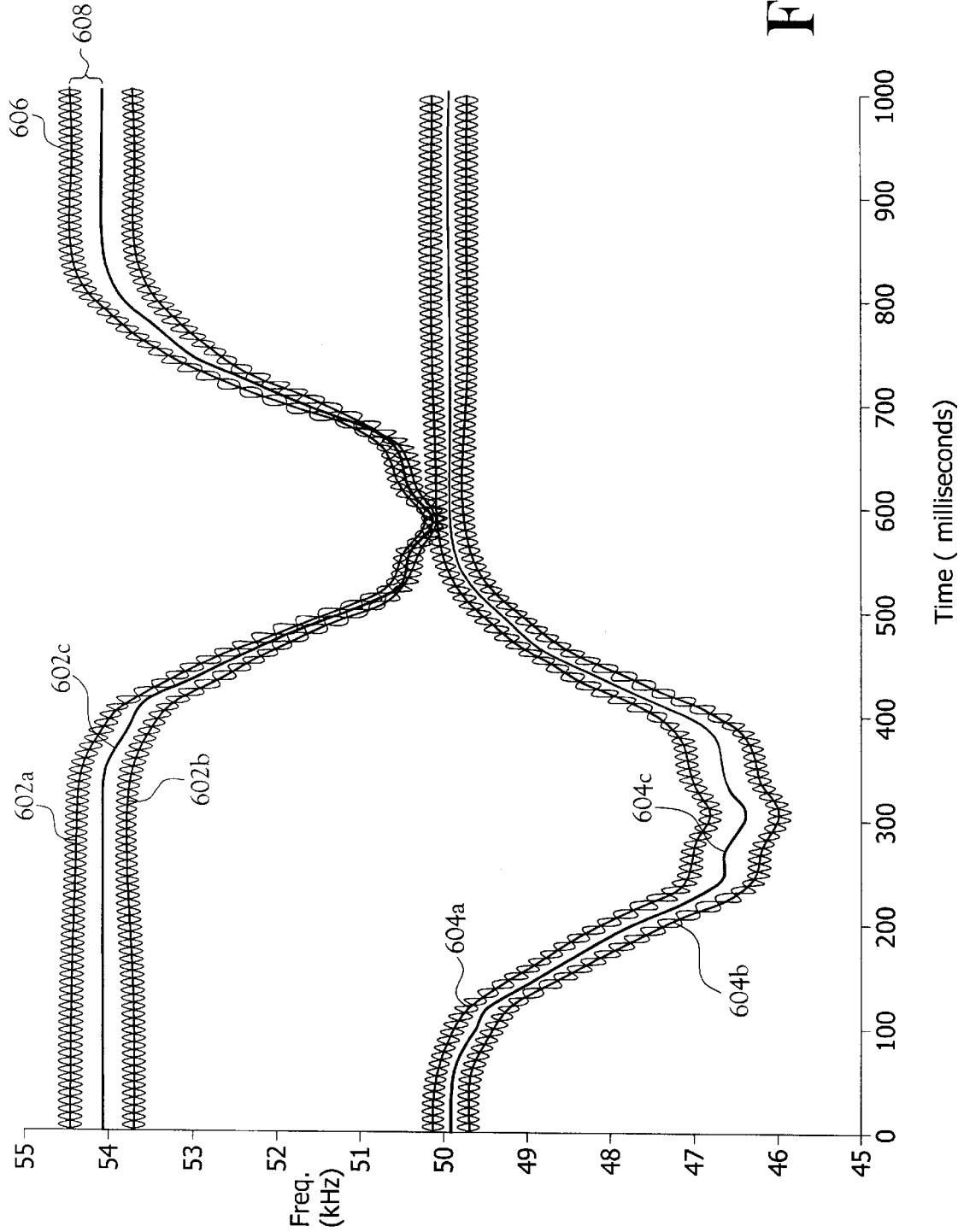
FIG. 6 is a graphic representation of inductive signature data obtained using the oscillator circuit of the present invention.

Bipolar charge is useful for active isolation of the Caduceus oscillator frequency measurements from ambient noise 606 and crosstalk errors 608, as in FIG. 6, which illustrates inductive signature data obtained using an array of wire-loop sensors and the Caduceus oscillator of the present invention. Because induced currents are a significant cause of most ambient noise 606 and crosstalk errors 608, these errors have a distinct polarity. This is especially true for differental errors, which are the most difficult errors to deal with. On the other hand, the frequency of the oscillation is independent of its polarity.

Ambient noise 606 is actively isolated from the oscillator frequency 602a, 602b, 604a, 604b measurement by alternating the polarity of the excitation voltages on successive frequency measurement cycles. By alternating the excitation polarity, errors due to low-frequency ambient noise 606 become largely equal and opposite on alternating measurement cycles. Low-frequency ambient noise 606 is effectively canceled by adding any two adjacent and oppositely polarized inductive measurements together. Alternatively, low-frequency ambient noise is quantified by subtracting any two adjacent and oppositely polarized inductive measurements from each other.

Crosstalk 608 between two or more inductively coupled wire-loop sensors induces a non-random error into the frequency measurement of each detection cycle. This non-random error has a polarity attribute similar to that of ambient noise. Crosstalk errors are cancelled by alternating the relative polarity of the excitation circuits of inductively coupled detectors. By adding any two or more adjacent samples obtained from inductively coupled wire-loop sensors having oppositely polarized excitation circuits, crosstalk is substantially cancelled and by subtracting any two or more adjacent samples together the effect of the crosstalk error is quantified. Those skilled in the art will recognize that other mathematical functions for combining successive samples derived using different phase-permutations of the excitation circuit 108 are within the scope of the present invention.

Figure 7:
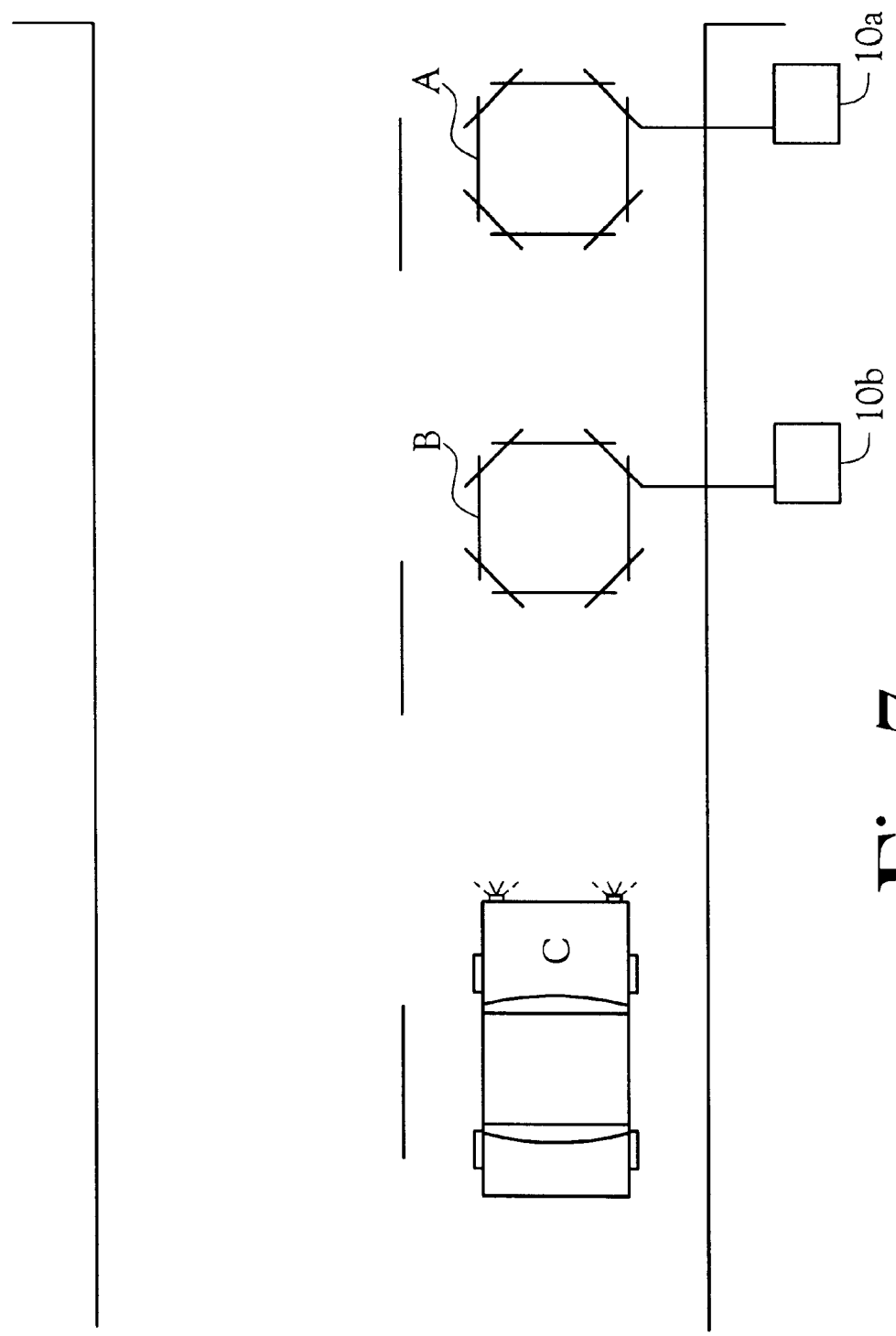
FIG. 7 is a graphic representation of an array of inductive loop sensors disposed in a speed-trap configuration.

The bipolar excitation circuit 108 produces two polarity, or phase, permutations for the wire-loop sensor. For an array having any number, n, of inductively coupled wire-loop sensors, each having a bipolar excitation circuit, it is possible to actively isolate the frequency measurement error due to any crosstalk path within the array. By way of example, consider an array of two inductively coupled wire-loops, as shown in FIG. 7. FIG. 7 illustrates the wire-loop sensor array having two 2-meter wire-loops A, B separated by a distance of approximately 2-meters and a vehicle C. If wire-loop A and wire-loop B are simultaneously excited and allowed to oscillate with any arbitrary set of polarities (e.g., loop A, negative polarity and loop B, negative polarity, there would be non-random errors, e[f(A)], e[f(B)], in the frequency measurements, f(A),f(B) due to crosstalk on the inductively coupled path.

Referring now to FIG. 6, a set of four inductive signatures 602a, 602b, 604a, 604b were recorded from the automobile C passing over the wire-loop sensor array A, B. The present invention actively isolates the non-random frequency measurement errors due to crosstalk for the inductively coupled wire-loops by proper selection of the excitation phases of each wire-loop sensor A, B in the array on successive samples. In the inductive signature data shown in FIG. 6, the non-random frequency measurement errors are actively isolated by exciting the array on successive cycles with a different set of phase permutations, e.g., wire-loop A, positive polarity wire-loop B, negative polarity and wire-loop A, negative polarity; wire-loop B, negative polarity. Providing inductively coupled wire-loop sensors A, B within an array with differing polarities inverts the non-random frequency measurement errors due to crosstalk and the non-random frequency errors are inverted relative to the original phase permutation. The central traces 602c, 604c represent the estimated inductive signatures after crosstalk errors 608 have been accounted for through active isolation by averaging each pair of traces 602a, 602b; 604a 604b. The trace pairs 602a, 602b; 604a, 604b represent the raw inductive signature data recorded by the wire-loop sensor circuits as each of the possible excitation circuit phase permutations were sequenced through on successive samples and exemplifies crosstalk quantification through active isolation. The sinusoid lines overlying the trace pairs represent the ambient noise 606. Those skilled in the art will recognize that crosstalk may be substantially canceled or quantified by active isolation in an array having any number of inductively coupled wire-loops through the use of suitably chosen phase-permutation sequences similar to that described for a two-loop array.

The vertical scale for these signatures represents frequency. In the absence of a vehicle, these two wire-loop sensor circuits have significantly different oscillation frequencies. As the test vehicle passes over the loops, the frequencies converge indicating that the crosstalk errors 608 are partially a function of the relative frequencies of the two oscillations.

Figure 8:
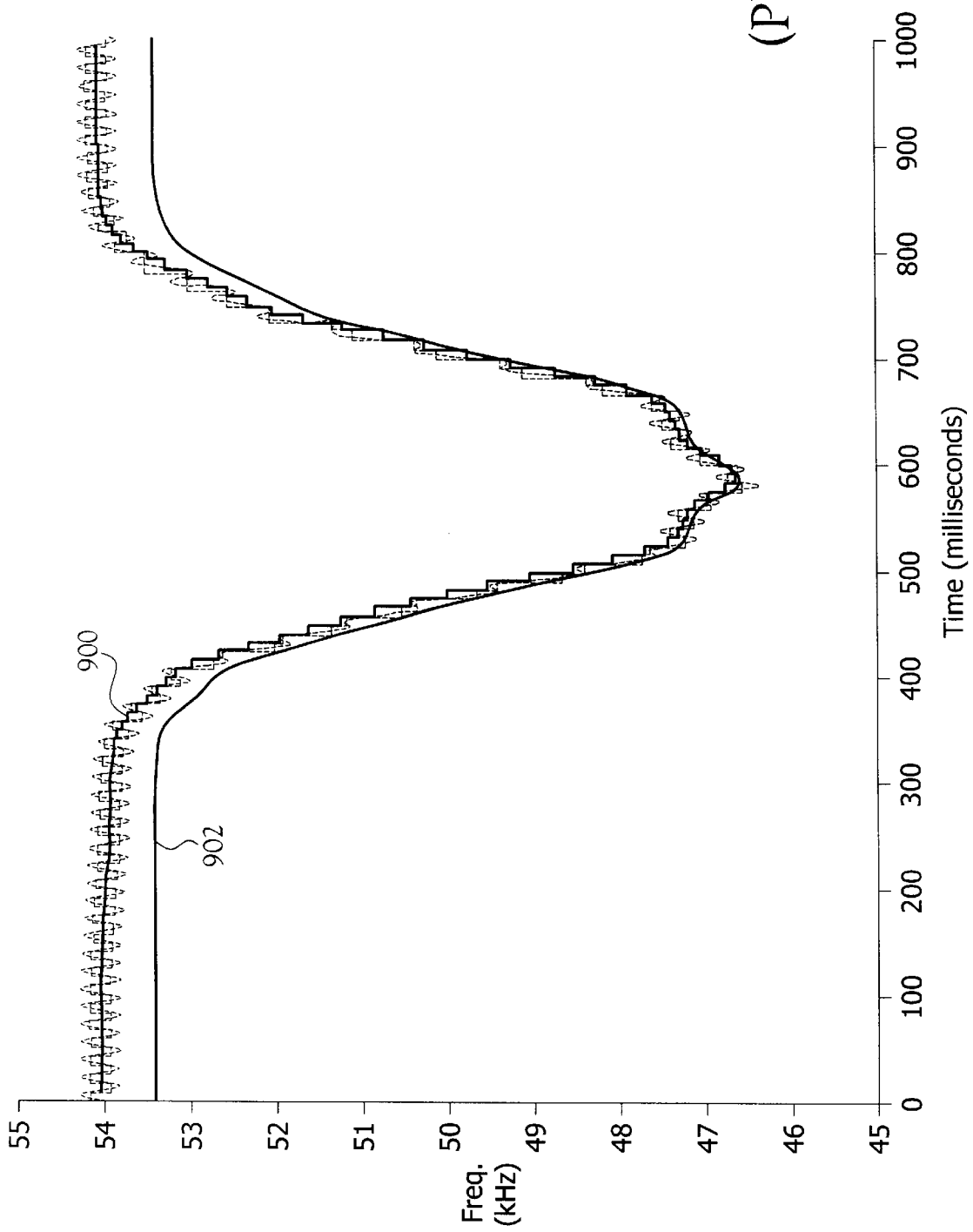
FIG. 8 is a graphic representation of inductive signature data obtained using a prior art oscillator circuit.

Contrast the inductive signature data obtained using the present invention with the inductive signature data obtained with a prior art LCR oscillator circuit, as shown in FIG. 8. In the prior art, the inability to vary the polarity of the oscillations between measurement cycles removes the ability to eliminate crosstalk errors between inductively coupled loops as only one set of raw data 900 at a singe polarity is obtained. Further, the sampling rate of the prior art circuit is limited to the power line frequency and ambient noise above the power line frequency can not be eliminated. Trace 902 represents the true inductive signature for comparison with the raw data 900.

While one embodiment has been shown and described, it will be understood that it is not intended to limit the disclosure, but rather it is intended to cover all modifications and alternate methods falling within the spirit and scope of the invention as defined in the appended claims.

Having thus described the aforementioned invention, we claim:

1. An oscillator circuit for use in an inductive sensor, said oscillator circuit comprising:
    a first capacitor;
    a second capacitor in electrical communication with said first capacitor;
    a wire-loop coupled to each of said first capacitor and said second capacitor;
    a voltage supply;
    an excitation circuit connectable with said first capacitor and said second capacitor to connect said voltage supply to said first capacitor and said second capacitor at a selected polarity and
    wherein either of said first capacitor and said second capacitor is charged to a preselected voltage by said excitation circuit and the other of said first capacitor and said second capacitor is discharged when said excitation circuit is connected and each of said first capacitor and said second capacitor is discharged when said excitation circuit is disconnected to produce a pair of decaying oscillations having a caduceus-shaped output.

2. The oscillator circuit of claim 1 wherein said excitation circuit is a plurality of switches.

3. The oscillator circuit of claim 2 wherein said oscillator circuit includes a ground such that when a first of said plurality of switches is closed, one of said first capacitor and said second capacitor is connected to said voltage supply and when a second of said plurality of switches is closed, the other of said first capacitor and said second capacitor is connected to said ground.

4. The oscillator circuit of claim 1 further comprising a transformer having a first coil and a second coil, said first coil electrically connected to said wire loop and said second coil in electrical communication with said first capacitor and said second capacitor whereby said wire loop is inductively coupled to each of said first capacitor and said second capacitor.

5. An oscillator circuit for use in an inductive sensor, said oscillator circuit comprising:
    a wire-loop;
    a resistance-capacitance network coupled to said wire-loop, said resistance-capacitance network including at least two capacitors;
    a voltage supply; and
    an excitation circuit connectable to said resistance-capacitance network to connect said resistance-capacitance network to said voltage supply at a selected polarity;
    wherein said resistance-capacitance network is charged to a preselected voltage by said excitation circuit when said excitation circuit is connected and said resistance-capacitance network is discharged when said excitation circuit is disconnected to produce a pair of decaying oscillations having a caduceus-shaped output.

6. The oscillator circuit of claim 5 wherein said excitation circuit is a plurality of switches.

7. The oscillator circuit of claim 6 wherein said oscillator circuit includes a ground such that when a first of said plurality of switches is closed, one of said at least two capacitors is connected to said voltage supply through said resistance-capacitance network and when said a second of said plurality of switches is closed, the other of said at least two capacitors is connected to said ground through said resistance-capacitance network.

8. The oscillator circuit of claim 5 further comprising a transformer having a first coil and a second coil, said first coil in electrical communication with said wire-loop and said second coil in electrical communication with said resistance-capacitance network whereby said transformer inductively couples said wire loop to said resistance-capacitance network.

9. A method for actively isolating noise in an inductive vehicle detector, said method comprising the steps of:
   (a) selecting a polarity of a voltage source to produce a polarized voltage output;
   (b) exciting a first capacitor using said polarized voltage output;
   (c) discharging a second capacitor;
   (d) isolating said first capacitor and said second capacitor from said voltage source;
   (e) oscillating said first capacitor and said second capacitor,
   (f) measuring a voltage of each of said first capacitor and said second capacitor;
   (g) producing an output signal related to a voltage differential between said first capacitor voltage and said second capacitor voltage;
   (h) terminating a measurement cycle when said first capacitor voltage and said second capacitor voltage are substantially equal and stable; and
   (i) repeating said steps of selecting a polarity of the voltage source to said step of terminating a measurement cycle.

10. The method of claim 9 wherein said step of producing an output signal includes the step of generating a pulse when said voltage differential alternates polarity.

11. The method of claim 9 further comprising the step of canceling noise by summing any two of said output signals produced in a successive pair of said measurement cycles.

12. The method of claim 9 further comprising the step of quantifying noise by subtracting any two of said output signals produced in a successive pair of said measurement cycles.

13. An oscillator circuit for use in an inductive sensor, said oscillator circuit comprising:
   means for measuring changes in an inductive field;
   means for storing a charge;
   means for exciting said means for storing the charge;
   means for interruptably connecting said means for exciting to said means for storing the charge;
   means for alternating a polarity of said means for exciting said means for storing the charge;
   means for discharging said means for storing the charge;
   means for measuring a voltage differential of said means for storing the charge;
   means for producing an output signal related to said voltage differential; and
   means for determining a frequently of said output signal.

* * * * *